United States Patent
Miao et al.

(10) Patent No.: US 10,138,540 B2
(45) Date of Patent: Nov. 27, 2018

(54) INFILTRATION DEVICE AND METHOD

(71) Applicant: Tianhe (Baotou) Advanced Tech Magnet Co., Ltd., Baotou (CN)

(72) Inventors: Juchang Miao, Baotou (CN); Yong Zhai, Baotou (CN); Jianxin Ma, Baotou (CN); Enfeng Gao, Baotou (CN); Yanling Song, Baotou (CN); Shulin Diao, Baotou (CN); Yi Dong, Baotou (CN); Haibo Yi, Baotou (CN); Shujie Wu, Baotou (CN); Yi Yuan, Baotou (CN); Ya Chen, Baotou (CN); Wenjie Yuan, Baotou (CN)

(73) Assignee: Tianhe (Baotou) Advanced Tech Magnet Co., Ltd. (CN)

(*) Notice: Subject to any disclaimer, the term of this patent is extended or adjusted under 35 U.S.C. 154(b) by 67 days.

(21) Appl. No.: 15/059,806

(22) Filed: Mar. 3, 2016

(65) Prior Publication Data
US 2017/0051390 A1   Feb. 23, 2017

(30) Foreign Application Priority Data
Aug. 20, 2015 (CN) .......................... 2015 1 0514589

(51) Int. Cl.
*C23C 14/04* (2006.01)
*H01F 41/02* (2006.01)
(Continued)

(52) U.S. Cl.
CPC .......... *C23C 14/046* (2013.01); *F27D 3/0024* (2013.01); *F27D 7/02* (2013.01);
(Continued)

(58) Field of Classification Search
CPC .............. C23C 14/505; C23C 16/4584; H01L 21/68764
See application file for complete search history.

(56) References Cited

U.S. PATENT DOCUMENTS 4,501,766 A * 2/1985 Suzuki .................. C23C 16/505
    118/50.1
4,937,095 A * 6/1990 Fukatsu ................. B01J 19/088
    136/258
(Continued)

FOREIGN PATENT DOCUMENTS

CN     102331194 A    1/2012
CN     103839670 A    6/2014

*Primary Examiner* — Parviz Hassanzadeh
*Assistant Examiner* — Nathan K Ford
(74) *Attorney, Agent, or Firm* — Lerner, David, Littenberg, Krumholz & Mentlik, LLP

(57) ABSTRACT

An infiltration device comprises a heating room, a rotary tray, a rotary bracket, a material box, an elevating mechanism and a transmission device, wherein the heating room has an annular groove, and the rotary tray is arranged below an opening end at a lower end of the heating room; the rotary bracket is installed on the rotary tray; the material box is arranged on the rotary bracket; the rotary tray and the material box can move upward and downward under the action of the elevating mechanism; the rotary bracket can spin in the annular groove and revolve around a central axis of the rotary tray under the action of the transmission device. The infiltration method provided by the invention comprises the steps of charging, vacuum-pumping, high temperature infiltrating, cooling, discharging, etc.

4 Claims, 3 Drawing Sheets

(51) Int. Cl.
  *F27D 3/00* (2006.01)
  *F27D 7/02* (2006.01)
  *F27D 19/00* (2006.01)
  *F27D 21/00* (2006.01)

(52) U.S. Cl.
  CPC ............ *F27D 19/00* (2013.01); *F27D 21/00* (2013.01); *H01F 41/0293* (2013.01); *F27D 2003/0034* (2013.01)

(56) References Cited

U.S. PATENT DOCUMENTS

| | | | |
|---|---|---|---|
| 9,080,237 B2* | 7/2015 | Behres | C23C 16/301 |
| 2010/0068893 A1* | 3/2010 | Kato | C23C 16/345 |
| | | | 438/758 |
| 2012/0160167 A1* | 6/2012 | Alonzo et al. | C23C 16/513 |
| | | | 118/723 I |

* cited by examiner

INFILTRATION DEVICE AND METHOD

CROSS-REFERENCE TO RELATED APPLICATIONS

The present application claims priority from Chinese Patent Application No. 201510514589.1 filed Aug. 20, 2015, the disclosure of which is hereby incorporated herein by reference.

TECHNICAL FIELD OF THE INVENTION

The invention relates to an infiltration device and method, and in particular, to an infiltration device and method for infiltration treatment of surface layers of magnets.

BACKGROUND OF THE INVENTION

Surface infiltration of Dysprosium and Terbium is a new technology for surface layer treatment after a high performance NdFeB rare earth permanent magnet is sintered into a blank. Through infiltration of Dysprosium and Terbium into a certain depth range from the surface layer of the magnet, the thermal resistance and coercive force of the magnet can be prominently improved. Therefore, such an infiltration technology has been preliminarily applied in the field of manufacturing a high performance NdFeB rare earth permanent magnet.

A high temperature vacuum infiltration furnace is a high temperature vacuum furnace capable of performing Dysprosium and Terbium infiltration heat treatment on the surface layer of the sintered permanent magnet. The structure of the main body of an ordinary high temperature vacuum furnace comprises a furnace body capable of performing heating and vacuum-pumping, and a drive mechanism capable of driving workpieces to move therein. For example, Chinese patent application No. CN102331194A discloses a high temperature vacuum furnace comprising a furnace body having an inner cavity, a furnace cover disposed at an opening of the inner cavity, an observing hole disposed at the furnace cover for observing the movement of processed workpieces inside the inner cavity and a drive mechanism for driving the processed workpieces to move. The high temperature vacuum furnace further comprises a control box for controlling the drive mechanism. A monitor is disposed in the observing hole, a display is provided on the control box, and the monitor is electrically connected to the display. However, the infiltration process is highly sensitive to the temperature, and an ordinary high temperature vacuum furnace cannot meet the requirements. During infiltration treatment, a control over the temperatures of individual infiltrated magnets inside the heating room will directly affect the quality of infiltration of surface layers of magnets. The difference in the heating temperature for magnets at different positions and the difference in the speed of increasing temperature or decreasing temperature will both lead to differences in the thickness and quality of infiltration layers of the magnets, thus seriously affecting the consistency of the performance of the products, and even interrupting normal production.

Currently, an ordinary vacuum sintering furnace is normally used for an infiltration device which performs surface infiltration treatment on magnets. For example, Chinese patent application No. CN103839670A discloses a magnet preparing method for improving the coercive force of a sintered NdFeB permanent magnet, comprising the steps of: a): using a vacuum fast-setting technology to prepare a blank of an NdFeB alloy magnetic material; b): performing the following treatments on the blank in sequence: chamfering-rinsing-washing-surface modification-washing; c) electroplating the treated permanent magnet with a nickel/heavy rare earth composite coating; and d) placing the sintered NdFeB magnetic material in a vacuum heat treatment furnace for heat treatment. When an ordinary vacuum heat treatment furnace is used to perform surface layer infiltration, the effect is not desirable. This is mainly because the infiltrated NdFeB magnets are stationary in the furnace body, and heat is transferred from the magnets placed at an outer layer to the magnets placed at an inner layer. Moreover, the temperatures at different positions in the heat treatment furnace have deviations, thus leading to the difference in the temperature of the magnets disposed at different positions during the process of heating to keep the temperature, or the process of increasing or decreasing the temperature. As a result, the finished products are inconsistent in the depth of the infiltration layer, and their performance differs from one to another.

SUMMARY OF THE INVENTION

In order to overcome the disadvantages in the prior art, the invention provides an infiltration device and method capable of solving the problem of inconsistency of the temperature of infiltrated magnets and inconsistency of the speed of increasing or decreasing temperature.

The infiltration device provided by the invention comprises:
  a heating room having an annular groove and provided with a heating room opening end at a lower end;
  a rotary tray arranged below the heating room opening end;
  a rotary bracket installed on the rotary tray;
  a material box arranged on the rotary bracket;
  an elevating mechanism that enables the rotary tray to move upward and downward so that the rotary bracket and the material box enter the annular groove from the heating room opening end or exit the opening end from the annular groove; and
  a transmission device for enabling the rotary bracket to spin in the annular groove and revolve around a central axis of the rotary tray.

In the infiltration device according to the invention, preferably, the heating room comprises:
  heating members disposed at both sides of an inner wall of the annular groove, the heating members being at an equal distance from a center of the rotary bracket so as to perform an equal-distance heating on the material box from both sides; and
  a heating room temperature keeping member, the heating room temperature keeping member forming the annular groove, wherein a surface layer of the heating room temperature keeping member is a reflective screen, and a fire-resistant temperature keeping material is filled inside the heating room temperature keeping member.

In the infiltration device according to the invention, preferably, the heating room further comprises:
  vents provided at an upper portion of the heating room and arranged in an annular array; and
  a vent opening/closing unit provided below the vents for opening/closing the vents, the vent opening/closing unit having a reflective screen that serves to keep the temperature when the vent opening/closing unit is in a closed state, wherein the vents are not completely closed when the vent opening/closing unit is in the closed state.

In the infiltration device according to the invention, preferably, the rotary tray comprises:
  a tray temperature keeping member for keeping the temperatures of the heating room and the material box; and
  a support member provided below the tray temperature keeping member, a cooling channel being provided inside the support member.

In the infiltration device according to the invention, preferably, the infiltration device further comprises:
  a controller for controlling a rotation speed of the rotary tray and a heating temperature of the heating room.

In the infiltration device according to the invention, preferably, the rotary brackets are installed on the rotary tray in an annular array via rotary mechanisms.

In the infiltration device according to the invention, preferably, the transmission device comprises:
  a first transmission member for driving the rotary tray to rotate and for driving the rotary bracket to revolve around the central axis of the rotary tray; and
  a second transmission member for driving the rotary bracket to spin.

In the infiltration device according to the invention, preferably, the material box has a protrusion at the bottom, an upper cover of the material box has a recessed groove, and the protrusion of the material box and the recessed groove of the material box are arranged to fit with each other so that different material boxes are superimposed on each other in a concentric positioning manner.

In the infiltration device according to the invention, preferably, the rotary bracket has a recessed groove in the upper portion, and the recessed groove of the rotary bracket and the protrusion at the bottom of the material box are arranged to fit with each other so that the material box is placed on the rotary bracket in a concentric positioning manner.

The invention further provides a method for performing high temperature infiltration on magnets using any of the above-mentioned infiltration devices, comprising the steps of:

(1) charging:
  placing a single layer or plural layers of the magnets in the material box;
  using the elevating mechanism to lower the rotary tray and the rotary brackets as a whole so as to place a single layer or plural layers of the material boxes on the rotary brackets;
  using the elevating mechanism to raise the rotary tray and the rotary brackets as a whole so that the material boxes enter the annular groove of the heating room;

(2) vacuum-pumping:
  vacuum-pumping the heating room;

(3) high temperature infiltrating:
  using the transmission device to rotate the rotary tray so that the rotary bracket spins in the annular groove and revolves around the annular groove of the heating room; controlling the rotation speed of the rotary tray and the heating temperature of the heating room so as to perform infiltration treatment on the magnets;

(4) cooling:
  delivering argon gas cooled by circulation into the heating room from the vents so as to cool the magnets loaded in the material boxes and having been subjected to the infiltration; and (5) discharging:
  using the elevating mechanism to lower the rotary tray so as to withdraw the material boxes loaded with the magnets having been subjected to the infiltration.

The invention brings about the following advantageous technical effects. The material box is placed on the rotary bracket, spins along with the rotary bracket and revolves around the annular groove of the heating room, thus achieving high temperature infiltration by rotary transposition and ensuring equality of the condition on the position of magnets. The material boxes are concentrically placed on the rotary bracket, thereby further ensuring equality of the condition on the position of magnets. Furthermore, the heating room has an annular groove structure and performs equal-distance heating from both sides, thereby realizing equality of the condition on the heating environment. Therefore, the invention eliminates a difference in the temperature of magnets caused by the temperature difference at different positions of the heating room, and improves consistency of the thickness of infiltration layers of magnets; the consistency of the performance of finished products is also improved; moreover, when the speed of increasing temperature or decreasing temperature is raised, the consistency of the temperature of magnets can be also ensured, thus reducing energy consumption and shortening production cycle.

DESCRIPTION OF REFERENCE SIGNS

Figure 1:
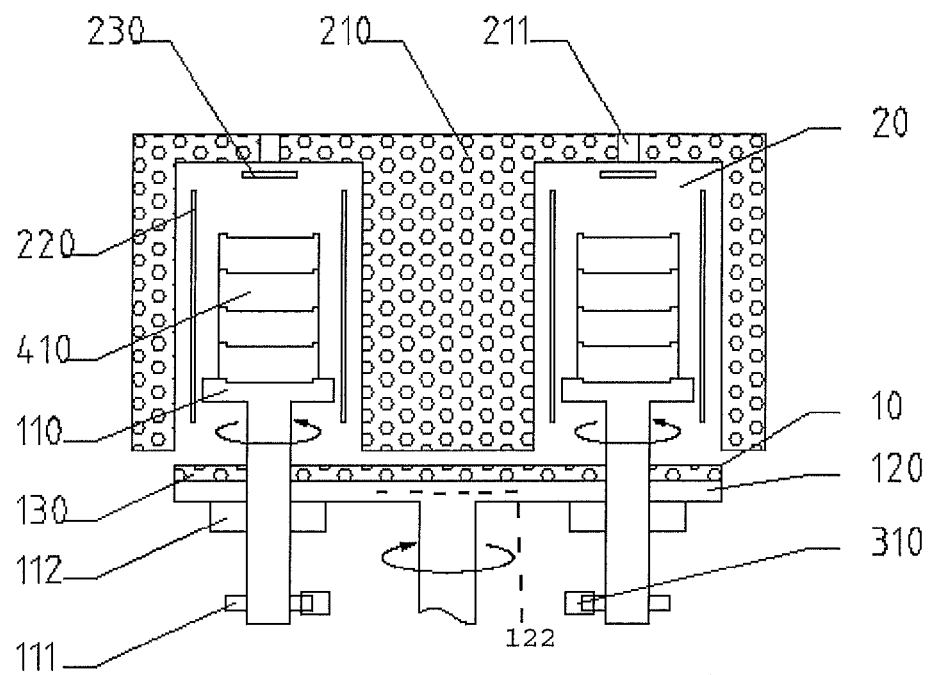
FIG. 1 is a schematic sectional view of the infiltration device of the invention.

10—rotary tray; 110—rotary bracket; 120—support member; 130—tray temperature keeping member; 111—driven gear; 112—rotary mechanism; 20—heating room; 210—heating room temperature keeping member; 220—heating member; 230—vent opening/closing unit; 211—vents; 310—drive gear; 410—material box.

DETAILED DESCRIPTION OF THE EMBODIMENTS

The invention will be further described hereinafter with reference to the accompanying drawings and exemplary embodiments, but the scope of protection of the invention is not limited to this.

The limitations for directions such as "upper", "lower" or the like in the invention merely represent relative directions between relative components of the infiltration device of the invention. The limitations for materials such as "high temperature resistant", "high strength" or the like in the invention are made based on common knowledge in the art, and are commonly used terms, the meanings of which can be clearly understood by those skilled in the art.

<Infiltration Device>

The infiltration device (i.e., diffusion device) provided by the invention can be an infiltration device for performing infiltration treatment (i.e., diffusion treatment) on surface layers of magnets, e.g. an infiltration furnace. Specific examples of the infiltration device include but are not limited to a high temperature vacuum infiltration furnace. The infiltration device provided by the invention comprises a heating room, a rotary tray, a rotary bracket, a material box, an elevating mechanism and a transmission device, wherein the heating room has an annular groove as an accommodation space for heating and infiltration treatment and is provided with a heating room opening end at a lower end; the rotary tray is arranged below the heating room opening end; the rotary bracket is installed on the rotary tray; the material box is arranged on the rotary bracket; the rotary tray and the material box can move upward and downward under the action of the elevating mechanism so that the rotary bracket and the material box enter the annular groove from the heating room opening end or exit the opening end from the annular groove; and the rotary bracket can spin in the annular groove and revolve around a central axis of the rotary tray under the action of the transmission device.

In the infiltration device according to the invention, preferably, the heating room comprises heating members and a heating room temperature keeping member. The heating members are disposed at both sides of an inner wall of the annular groove and can be in a distributed arrangement, e.g., in a strip-like grating arrangement. Preferably, the heating members are disposed at both sides of an inner wall of the annular groove in an annular form. The heating members at both sides had better be at an equal distance from a center of the rotary bracket so that equal-distance heating can be performed on the material box from both sides. The heating members can be made from various high temperature resistant metal materials in the art, preferably from a high temperature resistant molybdenum sheet, with a thickness of 1-5 mm, and preferably 1.5-3 mm. In one preferred embodiment of the invention, the thickness is 2 mm. The width of each high temperature resistant molybdenum sheet can be 30-80 mm, and preferably 40-60 mm. The heating room temperature keeping member forms the annular groove, wherein a surface layer of the heating room temperature keeping member is a reflective screen, and a fire-resistant temperature keeping material is filled inside the heating room temperature keeping member. The reflective screen can be made from various high temperature resistant metal sheets, e.g., a high temperature resistant molybdenum sheet, with a thickness of 0.1-3 mm, and preferably 1-2 mm. In one preferred embodiment of the invention, the thickness is 1 mm. The fire-resistant temperature keeping material can be those commonly used in the art, and preferably is a fire-resistant brick or a high temperature resistant mullite.

Other components related to the heating treatment should also be made from high temperature resistant materials. For example, the material for making the material box may comprise thermal resistant steel or graphite.

In the infiltration device according to the invention, preferably, the heating room further comprises vents and a vent opening/closing unit. The vents are airflow channels for controlling the air pressure of the heating room, and are preferably provided at an upper portion of the heating room and arranged in an annular array. The vent opening/closing unit is provided below the vents for opening/closing the vents. Preferably, the vent opening/closing unit has a reflective screen that serves to keep the temperature when the vent opening/closing unit is in a closed state. When the vent opening/closing unit is in the closed state, the vents are not completely closed so that gas circulation can still occur inside and outside the heating room.

In the infiltration device according to the invention, preferably, the infiltration device further comprises a controller for controlling a rotation speed of the rotary tray and a heating temperature of the heating room. The type and the control program of the controller are not restricted, as long as the controller can realize the above-mentioned control function, and the controller can be made based on the prior art. For example, the controller may comprise an inverter for controlling a rotation speed of the rotary tray or a speed controller of a variable frequency speed-changing motor, and a power controller for controlling the temperature inside the heating room.

In the infiltration device according to the invention, preferably, the rotary tray comprises a tray temperature keeping member and a support member. The tray temperature keeping member keeps the temperatures of the heating room and the material box, and the support member is provided below the tray temperature keeping member so as to provide support for the tray temperature keeping member. The support member is preferably made from a high strength high temperature resistant metal material. The support member is preferably provided with a cooling channel therein for performing temperature reducing and cooling treatment after high temperature treatment is finished.

In the infiltration device according to the invention, preferably, the rotary brackets are installed on the rotary tray in an annular array via rotary mechanisms. The rotary mechanism enables the rotary bracket to not only be relatively fixed but also spin, and there is no limitation on the specific form of the rotary mechanism.

In the infiltration device according to the invention, preferably, the transmission device comprises a first transmission member and a second transmission member. The first transmission member is used for driving the rotary tray to rotate and for driving the rotary bracket to revolve around the central axis of the rotary tray, and may comprise a worm-gear reducer or a cycloidal pin wheel reducer. The second transmission member is used for driving the rotary bracket to spin, and may comprise a drive gear installed on the rotary tray and a driven gear installed on the rotary bracket for engaging with the drive gear.

In the infiltration device according to the invention, a detachable connection can be realized between the material boxes as well as between the material box and the rotary bracket in various ways. Preferably, the material box has a protrusion at the bottom, and an upper cover of the material box has a recessed groove, wherein the protrusion and the recessed groove can fit with each other so that the material boxes are superimposed on each other in a concentric positioning manner. More preferably, the rotary bracket has a recessed groove in the upper portion, and the recessed groove of the rotary bracket and the protrusion at the bottom of the lowest material box on the rotary bracket fit with each other so that the material box is placed on the rotary bracket in a concentric positioning manner. The shapes of the protrusion and the recessed groove can be circular, square, triangular, etc.

<Infiltration Method>

The invention further provides a method for performing high temperature infiltration on magnets using any of the above-mentioned infiltration devices. The method comprises the steps of charging, vacuum-pumping, high temperature infiltrating, cooling, discharging, etc. The following are details:

(1) Charging:

Placing a single layer or plural layers of the magnets in the material box; using the elevating mechanism to lower the rotary tray and the rotary brackets as a whole so as to place a single layer or plural layers of the material boxes on the rotary brackets; using the elevating mechanism to raise the rotary tray and the rotary brackets as a whole so that the material boxes enter the annular groove of the heating room. The magnets can be various magnets that have been subjected to surface layer treatment, e.g., a sintered NdFeB magnet coated with super fine Dysprosium Fluoride powder all over the surface.

(2) Vacuum-Pumping

Vacuum-pumping the heating room. Specifically, the vent opening/closing unit provided below the vents in the upper portion of the heating room is opened so that the gas inside the heating room is extracted and discharged from the infiltration device; when the pressure inside the infiltration device reaches a predetermined value, the vent opening/closing unit is closed. The closing of the vent opening/closing unit will not lead to the complete closing of the gas channels of the heating room, and the vent opening/closing unit merely serves as a reflective screen for keeping the temperature.

(3) High Temperature Infiltrating:

Using the transmission device to rotate the rotary tray so that the rotary bracket spins in the annular groove and revolves around the annular groove of the heating room; controlling the rotation speed of the rotary tray and the heating temperature of the heating room so as to perform infiltration treatment on the magnets. Preferably, the process of performing infiltration treatment on the magnets is as follows: increasing the temperature of the magnets up to 850-950° C. at a rate of 3-8° C./min and keeping the temperature for 2-5 hours; vaporizing Dysprosium Fluoride powder, and after reduction by surface elements of the magnets, diffusing Dysprosium atoms into a grain boundary phase of the magnets through the magnet surfaces; decreasing the temperature of the magnets to 400-500° C. at a rate of 3-8° C./min using the power controller, and keeping the temperature for 2-5 hours. A more preferable treatment process is as follows: increasing the temperature of the magnets up to 880-920° C. at a rate of 4-6° C./min and keeping the temperature for 2.5-3.5 hours; vaporizing Dysprosium Fluoride powder, and after reduction by surface elements of the magnets, diffusing Dysprosium atoms into a grain boundary phase of the magnets through the magnet surfaces; decreasing the temperature of the magnets to 420-480° C. at a rate of 4-6° C./min using the power controller, and keeping the temperature for 2.5-3.5 hours.

(4) Cooling:

Delivering highly pure argon gas cooled by circulation into the heating room from the vents so as to cool the magnets loaded in the material boxes and having been subjected to the infiltration. A preferred specific operating method is as follows: stopping supply of gas when the pressure inside the high temperature vacuum infiltration furnace reaches $5.5 \times 10^4$ Pa to $6.5 \times 10^4$ Pa; stopping the circulation cooling system when the temperature inside the heating room is cooled to 20-30° C., and stopping rotation of the rotary tray and the rotary bracket; and delivering air into the infiltration device until the pressures inside and outside the infiltration device reach a balance.

(5) Discharging:

Using the elevating mechanism to lower the rotary tray so as to withdraw the material boxes loaded with the magnets having been subjected to the infiltration.

Embodiment 1

As shown in FIG. 1, the infiltration device comprises a rotary tray 10, rotary brackets 110, heating rooms 20 and material boxes 410, etc.

The rotary brackets 110 are installed on the rotary tray 10 located below the rotary brackets 110, and a plurality of rotary brackets are installed on the rotary tray 10 in an annular array so as to perform high temperature infiltration on a plurality of material boxes. The rotary brackets 110 are made from thermal resistant steel. The rotary brackets 110 and the rotary tray 10 form one piece via rotary mechanisms 112. The rotary tray 10 is provided with holes, in which bearings are installed. The rotary brackets 110 are installed on the rotary tray via the bearings.

Figure 4:
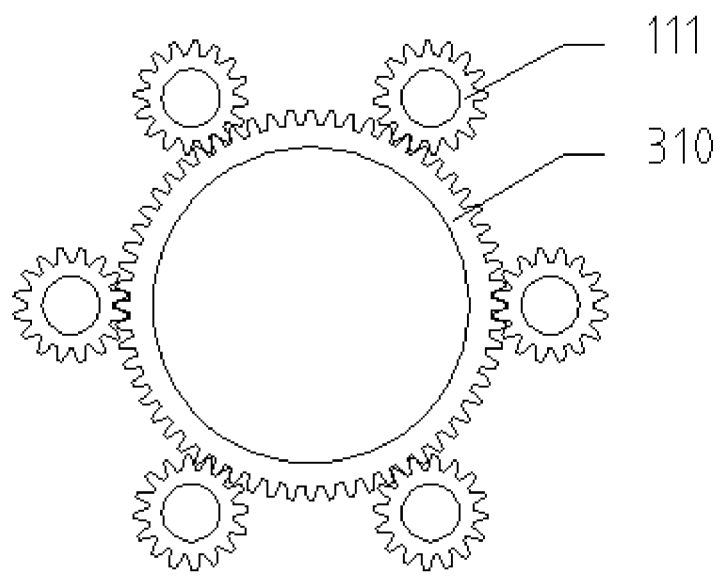
FIG. 4 is a schematic top view of the transmission mechanism for the rotary tray and the rotary bracket of the infiltration device of the invention.

With reference to FIGS. 1 and 4, a first transmission member for driving the rotary tray 10 to rotate in installed below the rotary tray 10. A second transmission member is installed below the rotary bracket 110 so as to drive the rotary bracket to spin via the rotation of the rotary tray. The second transmission member is in the form of gear transmission. Specifically, the second transmission member comprises a drive gear 310 installed on the rotary tray and a driven gear 111 installed on the rotary bracket for engaging with the drive gear. Since the rotary mechanism 112 is provided between the rotary bracket 110 and the rotary tray 10, when the first transmission member drives the rotary tray 10 to rotate, the rotary bracket 110 installed on the rotary tray 10 revolves around a central axis of the rotary tray 10. Through an engagement between the drive gear and the driven gear, the rotary bracket 110 can spin.

The rotary tray 10 is of a circular shape, and comprises a tray temperature keeping member 130 at an upper end and a support member 120 at a lower end. The tray temperature keeping member 130 keeps the temperature for the heating rooms 20 and the magnets, and the tray temperature keeping member 130 is made from fire-resistant bricks or high temperature resistant mullites. The support member 120 is made from thermal resistant steel, has a high strength and is high temperature resistant. Moreover, the support member has a cooling channel 122 therein, and cooling water circulates inside the cooling channel. Therefore, the several rotary brackets loaded on the support member are supported and the transmission machine below the support member is prevented from reaching a high temperature.

Figure 2:
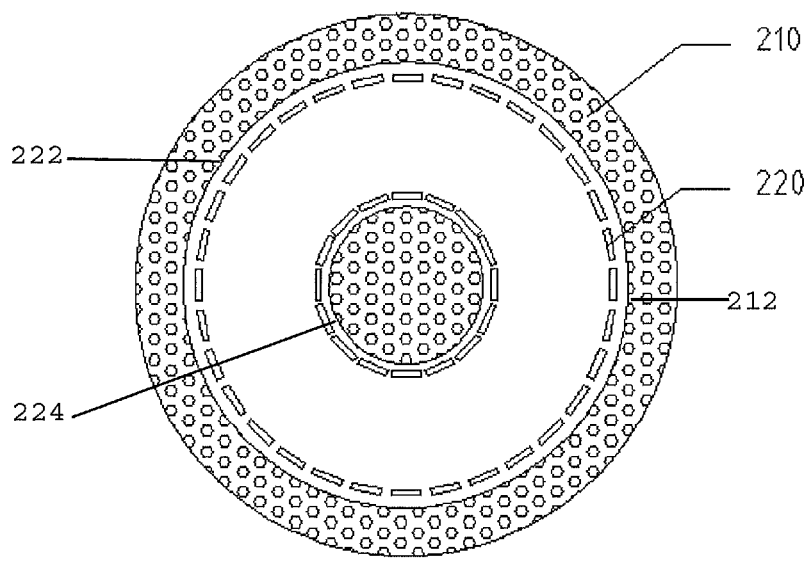
FIG. 2 is a schematic bottom view of the heating room of the infiltration device of the invention.
Figure 3:
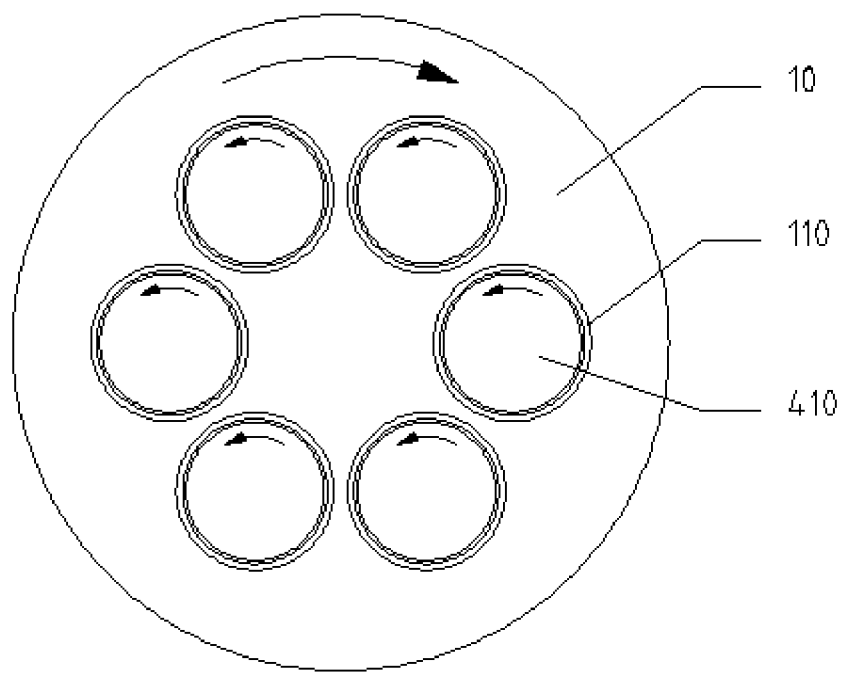
FIG. 3 is a schematic top view showing how the rotary tray and the rotary bracket of the infiltration device of the invention rotate.

The heating room 20 has an annular groove structure. With reference to FIGS. 1 and 2, a lower end of the heating room 20 is an opening end. The material box 410 loaded on the rotary bracket 110 rotates in the annular groove of the heating room 20. The heating room 20 comprises heating members 220 and a heating room temperature keeping member 210. The heating members 220 are installed at the opposing inner walls 222, 224 of the annular groove, and the heating members 220 at both sides are at an equal distance from a center of the rotary bracket 110 so as to perform equal-distance heating on the material box 410 from both sides. A surface layer of the heating room temperature keeping member 210 is a reflective screen 212, and a fire-resistant temperature keeping material is filled inside the heating room temperature keeping member 210 so as to keep the temperature for the heating rooms 20 and the magnets. The heating member 220 is made from a high temperature resistant molybdenum sheet material having a width of 50 mm and a thickness of 2 mm. The reflective screen is made from a high temperature resistant molybdenum sheet material having a thickness of 1 mm. The temperature keeping material is selected from fire-resistant bricks, high temperature resistant mullites, etc.

Moreover, as shown in FIG. 1, the upper portion of the heating room 20 is provided with a plurality of vents 211 arranged in an annular array. The vents 211 are used to cool the heating rooms and the material boxes during an air-cooling stage. A vent opening/closing unit 230 is installed below the vents 211 for opening/closing the vents. When the vent opening/closing unit 230 is closed, the air channels of the heating room 20 is not completely closed, and the vent opening/closing unit 230 merely serves as a reflective screen for keeping the temperature. The vent opening/closing unit 230 is made from a high temperature resistant molybdenum sheet material having a thickness of 1 mm. In the heating room 20, a temperature sensor is also provided for measuring the temperature inside the heating room 20.

The infiltration device further comprises a controller. The controller comprises an inverter for controlling a rotation speed of the rotary tray or a speed controller of a variable frequency speed-changing motor, and a power controller for controlling the temperature inside the heating room.

The material box 410 is of a cylindrical shape and a bottom of the material box has a circular protrusion. An upper cover of the material box has a circular recessed groove. The protrusion fits with the recessed groove so that the material boxes are placed in a concentric positioning manner. The material box 410 is made from thermal resistant steel. In addition, the upper portion of the rotary bracket 110 has a circular recessed groove structure, which fits with a bottom protrusion of the lowest material box so that the material box is placed on the rotary bracket in a concentric positioning manner.

Embodiment 2

Taking a sintered NdFeB magnet infiltrated with Dysprosium Fluoride and coated with super fine Dysprosium Fluoride powder all over the surface as an example, a workflow of the infiltration method according to the invention will be described in detail hereinafter with reference to the drawings. Of course, those skilled in the art can also use the infiltration method of the invention to perform relevant high temperature infiltration operations on other magnets.

Figure 5:
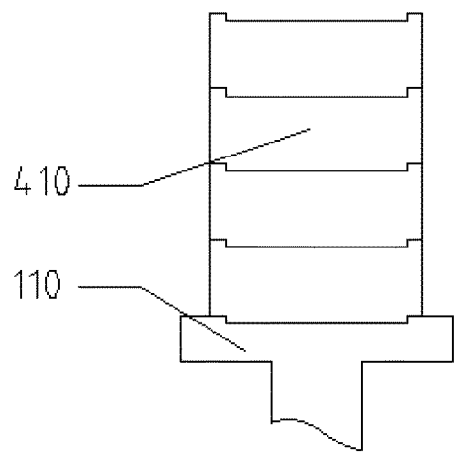
FIG. 5 is a schematic view showing the superimposition of the material boxes of the invention on the rotary bracket.

In this embodiment, the specific process is as follows:

Charging stage: an annular array of sintered NdFeB magnets coated with super fine Dysprosium Fluoride powders all over the surface is loaded in the cylindrical material box 410, wherein the magnets can be placed in a single layer or in several layers in the material box 410. The elevating mechanism lowers the rotary tray 10 and the rotary brackets 110 as a whole, wherein the elevating mechanism can be powered by a hydraulic cylinder. The material boxes 410 loaded with the sintered NdFeB magnets coated with super fine Dysprosium Fluoride powders all over the surface are superimposed on the rotary brackets 110. As shown in FIG. 5, the circular protrusion at the bottom of the material box 410, the circular recessed groove in the upper cover of the material box and the circular recessed groove at the upper portion of the rotary bracket 110 ensure that the superimposed material boxes 410 and the rotary bracket 110 are concentric. The height of the superimposed material boxes 410 does not exceed a height of a uniform temperature area of the heating room 20. When all the material boxes 410 are placed in position, the rotary tray 10 is raised together with the rotary brackets 110 and the furnace body is closed. Meanwhile, the material boxes 410 loaded with the sintered NdFeB magnets coated with super fine Dysprosium Fluoride powders all over the surface enter the heating room 20 having an annular groove structure. The magnets will be high temperature infiltrated in the heating room 20 having the annular groove structure. In addition, the heating members 220 having a high-temperature stability are installed at the left and right sides of the inner wall of the annular groove of the heating room 20, and the heating members 220 at the left and right sides are at an equal distance from a center of the rotary bracket 110. As mentioned previously, the superimposed material boxes 410 and the rotary bracket 110 are concentric. Thus, the heating members 220 at both sides are at an equal distance from the center of the material boxes 410 so that equal-distance heating treatment can be performed on the magnets from both sides. A surface layer of the heating room temperature keeping member 210 of the heating room 20 is a reflective screen, and a fire-resistant temperature keeping material is filled inside the heating room temperature keeping member 210 so as to keep the temperature for the heating room 20 and the magnets in the subsequent heating process.

Vacuum-pumping stage: a vacuum-pumping system starts operating, the vent opening/closing unit 230 provided below the vents 211 is opened so that the gas inside the heating room is rapidly extracted and discharged from the infiltration device; when the pressure inside the infiltration device reaches a predetermined value, the vent opening/closing unit is closed. When the pressure inside the furnace body reaches below $1 \times 10^{-3}$ Pa, the vent opening/closing unit 230 is closed.

High temperature infiltrating stage: the rotary tray 10 and the rotary bracket 110 start rotating, and the heating members 220 inside the heating room start heating. The vent opening/closing unit 230 below the vents 211 is closed. At this point, the gas channels of the heating room 20 are not completely closed, and the vent opening/closing unit 230 merely serves as a reflective screen for keeping the temperature. Through the control of the temperature sensor and the power controller inside the heating room, the heating members 220 increase the temperature of the sintered NdFeB magnets coated with super fine Dysprosium Fluoride powder all over the surface up to 900° C. at a rate of 5° C./min and the temperature is kept for 3 hours. During this process, the Dysprosium Fluoride powder will be vaporized, and after reduction by surface elements of the magnets, Dysprosium atoms are diffused into a grain boundary phase of the magnets through the magnet surfaces. Then, similarly, through the control of the temperature sensor and the power controller, the temperature of the sintered NdFeB magnets coated with super fine Dysprosium Fluoride powder all over the surface is decreased to 450° C. at a rate of 5° C./min and the temperature is kept for 3 hours. The heating is stopped, and the infiltration and aging process is completed.

Air-cooling stage: highly pure argon gas is delivered into the furnace body; when the pressure inside the furnace body reaches $6 \times 10^4$ Pa, supply of gas is stopped, and the vent opening/closing unit 230 provided below the vents 211 is opened so that the circulation air-cooling system start operating. The highly pure argon gas cooled by circulation enters the heating room 20 from the several vents 211 in an annular array, and cools the NdFeB magnets loaded in the material box 410 and having been subjected to the infiltration and aging. Through the control of temperature sensor, when the temperature inside the heating room 20 is cooled to 25° C., the circulation air-cooling system stops operating, and the rotary tray 10 and the rotary bracket 110 stop rotating. Air is introduced into the furnace body until the pressures inside and outside the furnace body reach a balance.

Final discharging stage: the rotary tray 10 is lowered, and the material boxes 410 loaded with magnets having been subjected to the infiltration are withdrawn. All the processes are finished.

It should be particularly noted that from the time when temperature increasing is started to the time when air-cooling is finished, the rotary tray 10 and the rotary bracket 110 are always in a rotating state.

As described above, in the infiltration device according to the invention, with the use of the rotary bracket 110 and the heating room 20 having an annular groove structure, the material boxes 410 spin and revolve around the heating room 20 having the annular groove structure during the process of high temperature infiltration and air-cooling, thus achieving equality of the condition on the position of infiltrated magnets. Moreover, the heating room 20 has an annular groove structure, and the material box 410 is placed on the rotary bracket 110 in a concentrical positioning manner so that the heating members 220 perform equal-distance heating on the magnets from both sides, thus realizing equality of the condition on the heating environment, ensuring consistency of the temperature of infiltrated magnets during a high temperature infiltration stage and an air-cooling stage, and improving consistency of the thickness of the infiltration layer of the magnets; the consistency of the performance of finished products is also improved; moreover, when the speed of increasing temperature or decreasing temperature is raised, the consistency of the temperature of the magnets can be also ensured, thus reducing energy consumption and shortening production cycle.

What is claimed is:

1. An infiltration device for performing infiltration treatment on surface layers of magnets comprising:
   a heating room having an annular groove formed by opposing inner walls and provided with a heating room opening end at a lower end;
   a rotary bracket installed on a rotary tray;
   a plurality of material boxes of cylindrical shape arranged on the rotary bracket, the material boxes adapted to be superimposed for supporting a single layer or a plurality of layers of the magnets;
   the rotary tray having a central axis and arranged below the heating room opening end, the rotary tray adapted to move upward and downward whereby the rotary bracket and the material boxes enter the annular groove from the heating room opening end or exit the heating room opening end from the annular groove; and
   a transmission device adapted to spin the rotary bracket in the annular groove and revolve around the central axis of the rotary tray;
   wherein the heating room includes heating members provided at the opposing inner walls forming the annular groove, the heating members provided at an equal distance from a center of the rotary bracket to perform an equal-distance heating on the material box from both inner walls; and a heating room temperature keeping member, the heating room temperature keeping member forming the annular groove, wherein a surface layer of the heating room temperature keeping member comprises a reflective screen, and a fire-resistant temperature keeping material is filled inside the heating room temperature keeping member;
   wherein the rotary tray includes a tray temperature keeping member for keeping the temperatures of the heating room and the material box; and a support member provided below the tray temperature keeping member, and a cooling channel provided inside the support member for maintaining a temperature of the magnets;
   wherein each of the material boxes have a circular protrusion formed at a center of a bottom surface and a circular recessed groove formed at a center of an upper surface, and the protrusion of one material box and the recessed groove of an underlying material box are arranged to fit with each other whereby a plurality of material boxes are adapted to be superimposed on each other in a concentric positioning manner; and
   wherein the rotary bracket has a circular recessed groove formed in its upper surface, and the recessed groove of the rotary bracket and the protrusion at the bottom surface of one of the material boxes are arranged to fit with each other whereby the one material box is placed on the rotary bracket in a concentric positioning manner;
   vents provided at an upper portion of the heating room arranged in an annular array; and
   a vent opening and/or closing unit provided below the vents inside the heating room for opening and/or closing the vents, the vent opening and/or closing unit having a reflective screen adapted to keep the temperature when the vent opening and/or closing unit is in a closed state, wherein the vents are not completely closed when the vent opening and/or closing unit is in the closed state.

2. The infiltration device according to claim 1, wherein the infiltration device further comprises:
   a controller for controlling a rotation speed of the rotary tray and a heating temperature of the heating room.

3. The infiltration device according to claim 1, wherein the rotary brackets are provided on the rotary tray in an annular array.

4. The infiltration device according to claim 1, wherein the transmission device comprises:
   a first transmission member adapted for driving the rotary tray to rotate and for driving the rotary bracket to revolve around the central axis of the rotary tray; and
   a second transmission member adapted for driving the rotary bracket to spin.

* * * * *